(12) United States Patent
Desai et al.

(10) Patent No.: US 10,578,740 B2
(45) Date of Patent: Mar. 3, 2020

(54) COHERENT OPTICAL DISTANCE MEASUREMENT APPARATUS AND METHOD

(71) Applicant: Mezmeriz Inc., Ithaca, NY (US)

(72) Inventors: Shahyaan Desai, Ithaca, NY (US);
Scott G. Adams, Ithaca, NY (US);
Clifford A. Lardin, Ithaca, NY (US)

(73) Assignee: Mezmeriz Inc., Ithaca, NY (US)

( * ) Notice: Subject to any disclaimer, the term of this patent is extended or adjusted under 35 U.S.C. 154(b) by 122 days.

(21) Appl. No.: 15/684,417

(22) Filed: Aug. 23, 2017

(65) Prior Publication Data

US 2019/0064358 A1    Feb. 28, 2019

(51) Int. Cl.
| | | |
|---|---|---|
| G01S 17/10 | (2006.01) | |
| H01S 5/022 | (2006.01) | |
| H01S 5/0683 | (2006.01) | |
| H01S 5/10 | (2006.01) | |
| H01S 5/40 | (2006.01) | |
| H01S 5/42 | (2006.01) | |
| G01S 7/481 | (2006.01) | |
| G01S 17/32 | (2020.01) | |

(52) U.S. Cl.
CPC .......... G01S 17/102 (2013.01); G01S 7/4813 (2013.01); G01S 7/4815 (2013.01); G01S 17/32 (2013.01); H01S 5/02252 (2013.01); H01S 5/0683 (2013.01); H01S 5/1028 (2013.01); H01S 5/4012 (2013.01); H01S 5/423 (2013.01)

(58) Field of Classification Search
CPC ...... G01S 17/102; G01S 7/4815; G01S 17/32; G01S 7/4813; G01S 155/0683; H01S 5/1028; H01S 5/4012; H01S 5/02252; H01S 5/423; H01S 5/0683
USPC ........................................................ 356/5.09
See application file for complete search history.

(56) References Cited

U.S. PATENT DOCUMENTS

| | | |
|---|---|---|
| 4,824,251 A | 4/1989 | Slotwinski et al. |
| 4,830,486 A | 5/1989 | Goodwin |
| 7,446,847 B2 | 11/2008 | Konno et al. |
| 8,620,164 B2 | 12/2013 | Heck et al. |
| 8,654,342 B2 | 2/2014 | Jensen et al. |
| 8,687,173 B2 | 4/2014 | Rezk et al. |
| 8,982,332 B2 | 3/2015 | Tachizaki et al. |
| 2011/0273699 A1 | 11/2011 | Sebastian et al. |
| 2015/0131078 A1 | 5/2015 | Soreide et al. |

OTHER PUBLICATIONS

Notification of Transmittal, International Search Report, and Written Opinion dated Oct. 24, 2018 for PCT Application No. PCT/US2018/047671; 8 pages.

*Primary Examiner* — Daniel L Murphy
(74) *Attorney, Agent, or Firm* — Bond, Schoeneck & King, PLLC; Jeffrey Powers (57) ABSTRACT

This disclosure presents a non-contact, frequency modulated continuous wave (FMCW) coherent optical distance measuring system and method for determining a measured distance over a wide distance range and simultaneously with fine range resolution. The approach and apparatus presented within eliminates the need for expensive, high frequency post-detection electronics to perform the necessary signal processing to accurately determine distance.

18 Claims, 7 Drawing Sheets

COHERENT OPTICAL DISTANCE MEASUREMENT APPARATUS AND METHOD

RELATED APPLICATION DATA

N/A.

GOVERNMENT FUNDING

N/A.

BACKGROUND

Aspects and embodiments of the invention most generally pertain to an optical distance measuring apparatus and method and, more particularly, to a chip-scale, optical distance measuring apparatus comprising a photonic integrated circuit and associated coherent detection method.

Miniaturized imaging systems capable of high precision 3D range measurements are of great interest as sensors in applications such as industrial inspection, construction and architecture, Virtual Reality, and autonomous vehicles. Coherent laser ranging (LIDAR) offers improved resolution over RADAR for distance measurement and 3D imaging applications because 1) the shorter wavelength of light and the ability to sweep a focused beam over a target results in finer angular resolution; 2) the possibility of frequency modulating (FMCW) the laser through a large bandwidth provides finer range (distance) resolution.

Briefly, coherent, FMCW, optical detection provides a frequency modulated or chirped source light beam to a target from where it is reflected and collected onto a photodetector. The return or echo light beam is then mixed with a local oscillator (LO) light beam on the photodetector resulting in interference patterns that may be processed to provide detailed range and velocity information about the target. In a heterodyne configuration, the source of the echo and LO beams are often two independent lasers, with different emission frequencies. In a homodyne configuration a fraction of the source light beam is split off to form a local oscillator light beam, in effect forming an interferometer where the path length between the point of source beam emission and the target forms one branch, and the other consisting of the path of the LO light beam in the system. The resulting fringe patterns from the optical mixing of the two beams are manifest as a beat frequency tone on point detectors such as p-i-n photodetectors. Both configurations take advantage of the source and reflected light beam reciprocity, resulting in an improved signal-to-noise (SNR) ratio and high range measurement accuracy. The heightened SNR permits the use of much smaller receiver apertures, and shorter sampling times, enabling miniaturization and rapid measurement speed.

Coherent LIDAR devices for precision measurements over small distances have been described by Goodwin, U.S. Pat. No. 4,830,486, and Slotwinski and Kenyon, U.S. Pat. No. 4,824,251. Goodwin, for example, discloses frequency modulating a laser, splitting the beam into reference and target components, recombining the beams to create a beat signal (heterodyning) and determining properties of the beat wave by analyzing a pattern of fringes obtained on a detector. Both patents describe fiber optic embodiments of the method. However, systems capable of high precision measurements <1 cm over long ranges >20 meters at rapid rates (>100,000 measurements/second) are impractical due to limitations in digitization technologies. A major limitation of conventional coherent FMCW lidar is the time-bandwidth product of the chirp, which forces a tradeoff between measurement range, range resolution, and sampling time due to the limits in analog detection, modulation, and high-resolution digitization technologies. Current signal digitization technologies are limited in bandwidth to about 2 GHz, and systems capable of operating at the upper bandwidth limits are often impractically expensive.

Thus, what is needed is a practical, miniature, and inexpensive optical distance measurement system capable of great accuracy, rapid measurements, and large dynamic measurement range, that does not trade-off measurement range, range resolution, and measurement time. The present invention discloses such a system.

SUMMARY

Aspects and embodiments of the present invention relate to an optical distance measuring apparatus comprising a first laser source for producing a first light beam, a second laser source for producing a second light beam, wherein the wavelength of the first and second light beams is substantially different. The first laser is modulated with a first frequency chirp and a first chirp rate, while the second laser is modulated with a second frequency chirp and a second chirp rate, wherein the first frequency chirp is lower than the second frequency chirp, and the first chirp rate is greater than the second chirp rate. The invention further includes a third and fourth laser to produce a third and fourth light beam, wherein the third and fourth lasers have non-identical, but close (0.001-1 nm) emission wavelengths. Each of the four lasers may have a single principal emission frequency which may be modulated or tuned to a different frequency by modulating or tuning the laser's injection current, gain medium current, temperature, cavity length, or a combination of these techniques.

The first and second light beams are combined by optomechanically coupling the first laser to a first input port of a first combiner formed within a photonic integrated circuit substrate, and the second laser to a second input port of a first photonic integrated circuit combiner, so that the combined light from the two light beams is output at a first input port of a first 3 dB directional coupler. Half the combined light beam is extinguished at a second output port of the first directional coupler, while the remainder is emitted at a first output port of the first directional coupler to which a gradient index rod lens and subsequently a partial Faraday mirror are optomechanically coupled. A predetermined fraction (0.1%-50%) of the light emitted at the first output port of the first directional coupler is reflected from the partial Faraday mirror back into the gradient index lens and into the first output port of the first directional coupler forming a first local oscillator (LO) light beam and a second local oscillator light beam. The remainder is transmitted through the partial Faraday mirror and towards focusing optics arranged so as to gradually focus the light, which is collected after being reflected from an object intersecting the gradually focusing combined light beam using the focusing optics, through the partial Faraday mirror, into the gradient index rod lens and subsequently into the first output port of the first directional coupler forming a first echo light beam and a second echo light beam. The combined first and second LO light beams and first and second echo light beams are directed towards the first input port of a second 3 dB directional coupler where it is split equally at the two output ports of the second directional coupler, where they are delivered onto the surface of a first and second photodetector, whereby the optical mixing of the first LO light beam and first echo light beam produces a modulation of the photocurrent of each photodetector at a first frequency, and the second LO light beam and second echo light beam produces a modulation of the photocurrent of each photodetector at a second frequency, both of which depend on the distance of the target.

The third and fourth light beams are also combined by optomechanically coupling the third and fourth lasers to a first and second input port of a second optical combiner formed within the photonic circuit substrate. The combined third and fourth light beams are delivered at a first and second output port of the second combiner and onto the surface of a third photodetector optically coupled to the first output port of the second combiner, and the fourth photodetector optically coupled to the second output port of the second combiner, whereby the optical mixing of the combined third and fourth light beams produces a modulation of the photocurrent of the third and fourth photodetectors at a frequency that corresponds to the difference in the emission frequencies of the third and fourth laser.

The beat tone produced by the optical mixing of the second LO light beam and second echo light beam occurs at a second high frequency and occurs for a second beat duration. The beat tone produced by the optical mixing of the first LO light beam and first echo light beam occurs at a first beat frequency that is lower than the second beat frequency, and occurs for a first beat duration that is shorter than the second beat duration. The first beat frequency provides a coarse estimate of the range of a target, and provides information about the range of beat frequencies that might result from the second chirp rate. A control circuit is used to tune the emission frequency of the third laser while the fourth is held constant so that the resulting beat frequency produced at the third and fourth photodetectors falls within the range of estimated range of beat frequencies resulting from the second chirp rate.

In a second embodiment the distance measuring apparatus replaces the first pair of lasers with a single laser that produces a first light beam. The laser is optomechanically coupled to a first input port of a first 3 dB directional coupler formed within a photonic integrated circuit substrate such that half the first light beam is extinguished at a second output port of first directional coupler, while the remainder is emitted at a first output port of the first directional coupler to which a gradient index rod lens and subsequently a partial Faraday mirror are optomechanically coupled; collecting a predetermined fraction of the light reflected from the partial Faraday mirror back into the gradient index lens and into the first output port of the first directional coupler forming the local oscillator (LO) light beam; transmitting the remainder of the first light beam through the partial Faraday mirror and towards focusing optics arranged so as to gradually focus the laser light; collecting light reflected from an object intersecting the gradually focusing light beam using the focusing optics, through the partial Faraday mirror, into the gradient index rod lens and subsequently into the first output port of the first directional coupler forming the echo light beam; directing the combined LO and echo light beam towards the first input port of the second 3 dB directional coupler where it is split equally at the two output ports of the second directional coupler; delivering combined LO and echo beam at each output port of the second directional coupler onto the surface of an opto-mechanical photodetector, whereby the optical mixing of the LO and echo signals produces a modulation of the photocurrent of each photodetector at a frequency that depends on the distance of the object.

Included also, are a second and third laser to produce a second and third light beam, wherein the second and third lasers have non-identical, but close emission wavelengths. The first laser is initially modulated at a first chirp frequency and at a first chirp rate to produce a first beat frequency on the photodetectors, which provides a coarse estimate of the range to a target, and an estimate of the range of beat frequencies that may be produced using a second different frequency chirp. This coarse range estimate is then used to tune the emission frequency of the third laser, while the fourth laser is held at a constant emission frequency such that the optical mixing of the second and third light beams on the third and fourth photodetectors results in a beat frequency that falls within the range of estimated range of beat frequencies resulting from the second chirp rate.

The existing art in precision FM laser radar incorporates a single chirp laser source and a polarization maintaining fiber optic geometry with separate local oscillator (LO) and signal paths, or a pair of lasers in a counter-chirp configuration to eliminate measurement artifacts due to target motion. The present invention incorporates three major improvements over the art. First, a dual laser configuration with different chirp amplitudes and chirp rates provides for simultaneous acquisition of a coarse distance measurement over a long range, and then a much finer distance measurement over the same distance range without the need for expensive high frequency digitization electronics. Second, a pair of lasers with non-identical, but close emission frequencies, wherein one laser's emission is tunable is used as a wide bandwidth frequency synthesizer to compress the beat frequency bandwidth of the laser radar. Third, collapsing the entire optical arrangement into an integrated photonic circuit, results in a system that is both less complicated and inexpensive due to fewer components; and immune to error caused by changes in the LO and signal path lengths due to factors such as temperature changes, and environmental vibrations.

DETAILED DESCRIPTION OF EXEMPLARY, NON-LIMITING EMBODIMENTS

In the following description, numerous specific details are set forth to clearly describe various specific embodiments disclosed herein. One skilled in the art will understand that the presently claimed invention may be practiced without all of the specific details discussed below.

Figure 1:
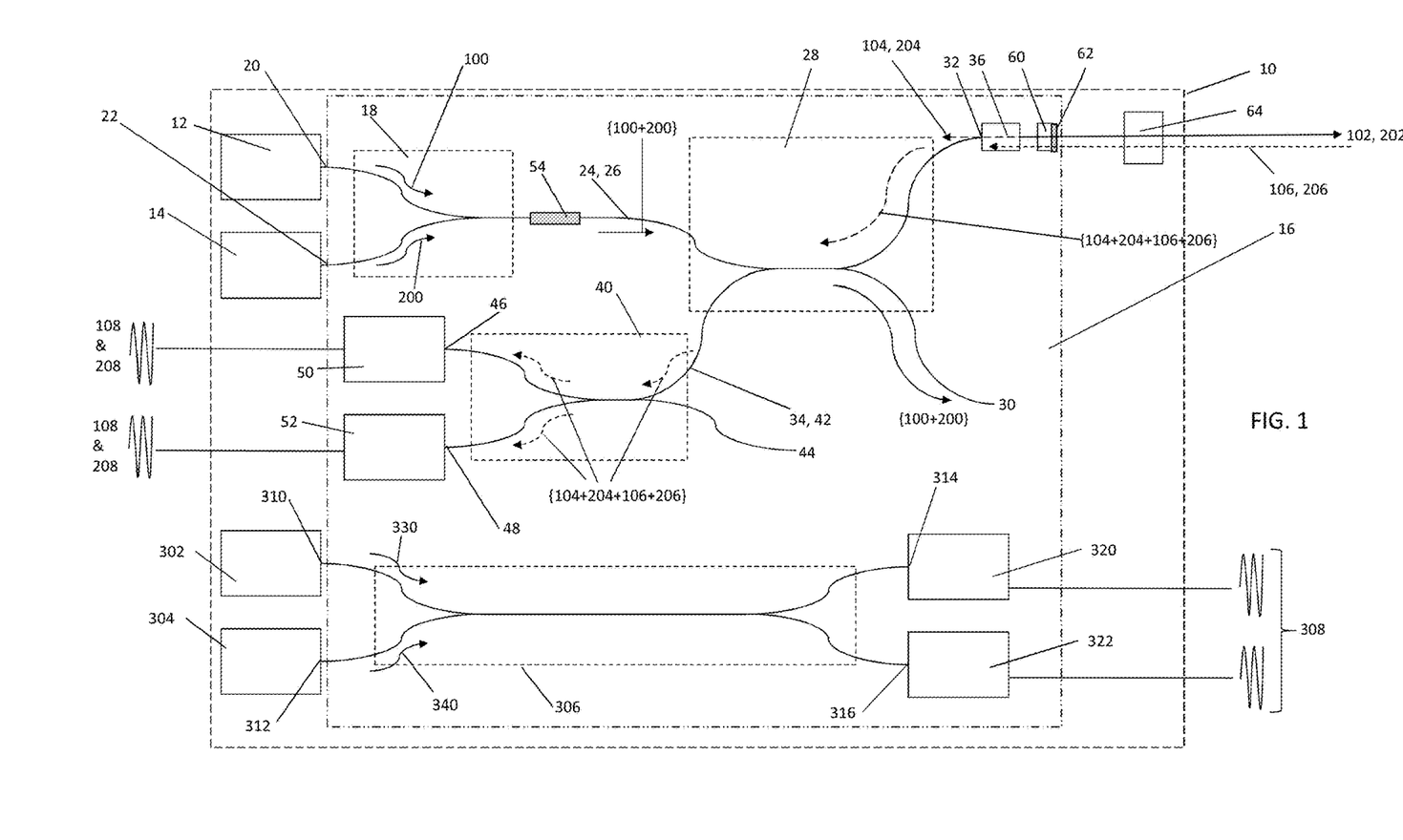
FIG. 1 shows a block diagram of a laser radar system according to an embodiment of the present invention.

FIG. 1 shows a block diagram of a distance measuring apparatus 10. The distance measuring apparatus 10 has a first single frequency laser diode 12, a second single frequency laser diode 14, both of which may emit linearly polarized radiation in the near infrared, mid infrared, or long wave infrared spectral regions, and made to chirp; i.e., be tuned to emit radiation at a range of frequencies centered around a center frequency by modulating the laser's injection current, temperature, bias current of the gain medium, cavity length, or a combination of all four. The modulation waveform is controlled to ensure that the emission frequency of each laser is modulated linearly over a time period. The lasers 12 and 14 are optomechanically coupled to a photonic integrated circuit 16 comprising of waveguides that are transparent to the emitted laser radiation, and configured to form a first optical combiner 18 with a first input port 20, a second input port 22, and a first output port 24; a first 3 dB directional coupler 28 with a first input port 26, a second input port 34, a first output port 32, a second output port 30; a second 3 dB directional coupler 40 with a first input port 42, a second input port 44, a first output port 46, a second output port 48.

Output port 24 is optomechanically coupled to a first input port 26 of a first 3 dB directional coupler 28. A first light beam 100 from the first laser 12 and a second light beam 200 from second laser 14 is routed through the combiner and into the first input port 26 of coupler 28 such that an equal fraction of the combined laser light comprising first light beam 100 and second light beam 200 is routed towards a second output 30 of coupler 28 where it is extinguished by the appropriate termination, while the other half of the combined laser light comprising first light beam 100 and second light beam 200 is routed into the first output port 32 where it is emitted as a first signal light beam 102 and a second signal light beam 202.

A gradient index rod lens 36 is optomechanically coupled to the first output port 32 of the first directional coupler 28, which routes the emitted first and second light beams 102 and 202 towards a partial Faraday mirror 60 that is optomechanically coupled to the gradient index rod lens 36. The partial Faraday mirror is formed by coating a magneto-optical material on the surface facing away from the gradient index rod lens with a material 62 that reflects a predetermined fraction of the first and second light beams 102 and 202 back towards the gradient index rod lens 36, while the rest of the laser radiation is transmitted towards focusing optics 64 that relay the light towards a remote object. The fraction of light reflected may be between 0.1%, up to 50% of the laser radiation emitted at port 32. The reflected portions of the first light beam 102 and second light beam 202 from the partial Faraday mirror 60 respectively become a first local oscillator (LO) signal 104 and a second local oscillator signal 204.

Light reflected from a remote object is collected back into the focusing optics 64, then through the partial Faraday mirror 60 and gradient index lens 36 and routed into the first output port 32 of the first directional coupler 28 as a first echo signal 106 and a second echo signal 206. The first output port 32 of the first directional coupler 28 simultaneously contains the LO light beams 104, and 204, and echo light beams 106 and 206. Half the combined LO and echo signal is routed back towards the first input port 24 of coupler 18 where it may be extinguished by an optical isolator 54. The other half of the combined LO and echo signal is routed towards the second input port 34 of the first directional coupler, which is also the first input port 42 of the second directional coupler 40. An equal fraction of the combined LO and echo light signals in the second directional coupler 40 is routed to the first and second output ports 46 and 48. Photodetectors 50 and 52 with a spectral response at the emission wavelength of lasers 12 and 14 are connected to output ports 46 and 48, such that the optical mixing of the first LO 104 and first echo 106 produces a modulation of the photocurrent of each detector 50 and 52 at a first beat frequency 108, and the optical mixing of the second LO 204 and second echo 206 produces a modulation of the photocurrent of each detector 50 and 52 at a second frequency 208 each of which encode the distance of the echo light signal's origin relative to the distance measuring pixel.

It will be apparent to those familiar with the art that in addition to the desired first and second beat frequencies 108 and 208, four other beat frequencies may also be produced by the optical mixing of the first LO 104 and the second echo 206, the second LO 204 and the first echo 106, the first LO 104 and the second LO 204, as well as the first and second echo signals 106 and 206. These can be eliminated with the judicious choice of wavelengths of the first and second lasers 12 and 14 such that these mixed products result in frequencies that fall beyond the range of measurement capabilities of the photodetectors. For example, a wavelength separation of ≥10 nm between the first and second lasers 12 and 14 would result in sum and difference mix products in excess of 1 THz, which is far beyond the response frequency of the detectors.

Figure 2:
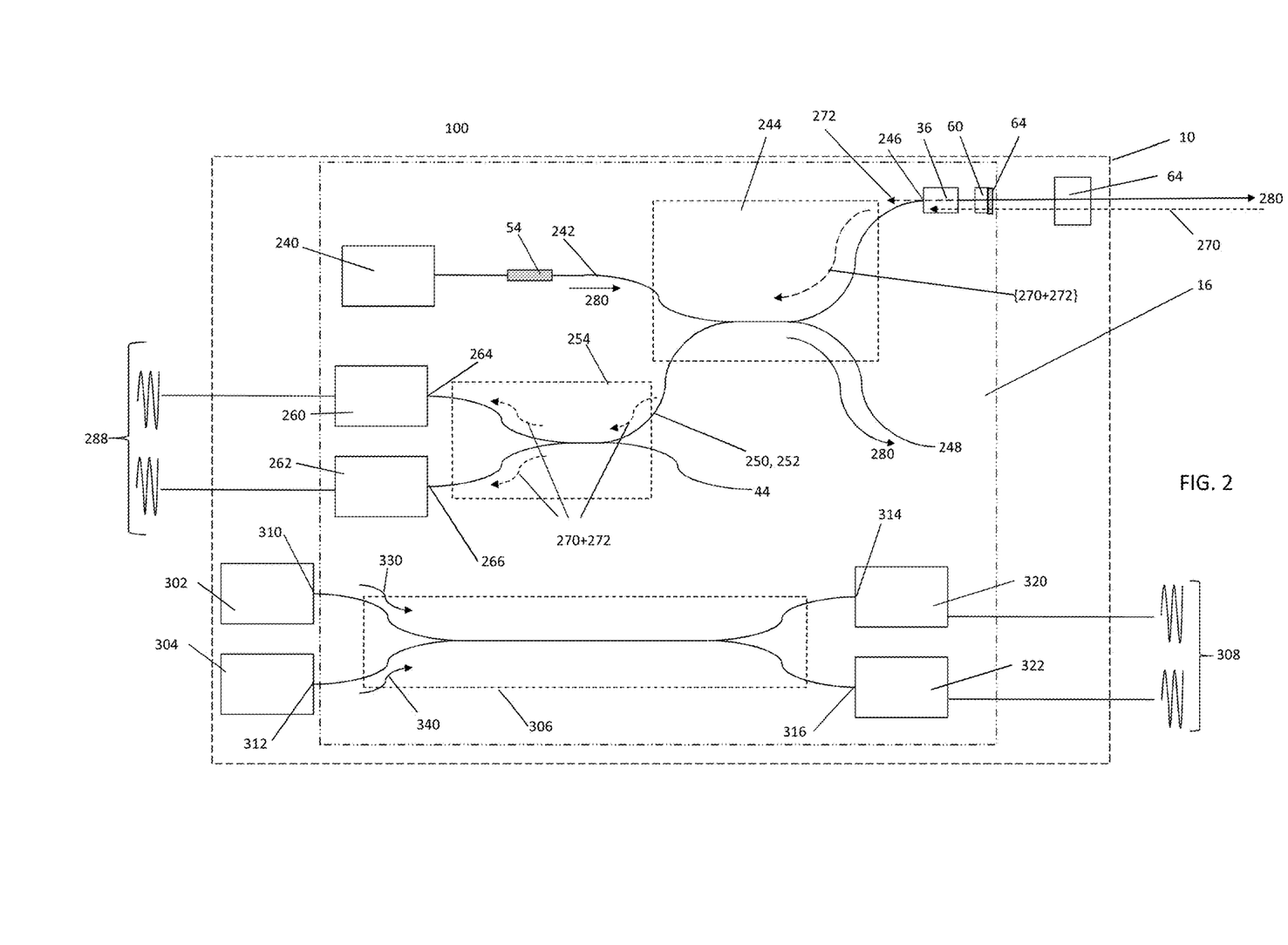
FIG. 2 shows a block diagram of another embodiment of a laser radar system.

FIG. 2 shows a block diagram of an alternative embodiment of the present invention, and highlights a single laser system, wherein laser 240 is optomechanically connected to a first input port 242 of a first 3 dB directional coupler 244. Half the chirped laser light 280 is extinguished at a second output port 248. The other half is emitted at a first output 246 and transmitted through gradient index lens 36 and then through partial Faraday mirror 60 towards focusing optics 64 and on towards a remote object. Reflected chirped light is collected back through optics 64 and routed through partial Faraday mirror 60 and gradient index lens 36 back into port 246 forming the echo signal 270. A fraction of the emitted chirped laser light is reflected from the partial Faraday mirror 60 and also similarly collected into output port 246 to form the LO signal 272. A second input port 250 of the first directional coupler 244 is optomechanically coupled to a first input port 252 of a second 3 dB coupler 254 where the combined chirped echo and chirped LO light is split into two, and directed towards photodetectors 260 and 262 each connected to a first output port 264 and a second output port 266 of second directional coupler 254. The optical mixing of light beams 270 and 272 on photodetectors 260 and 262 produce a beat frequency 288 which provides information of the distance to the remote object.

Figure 3:
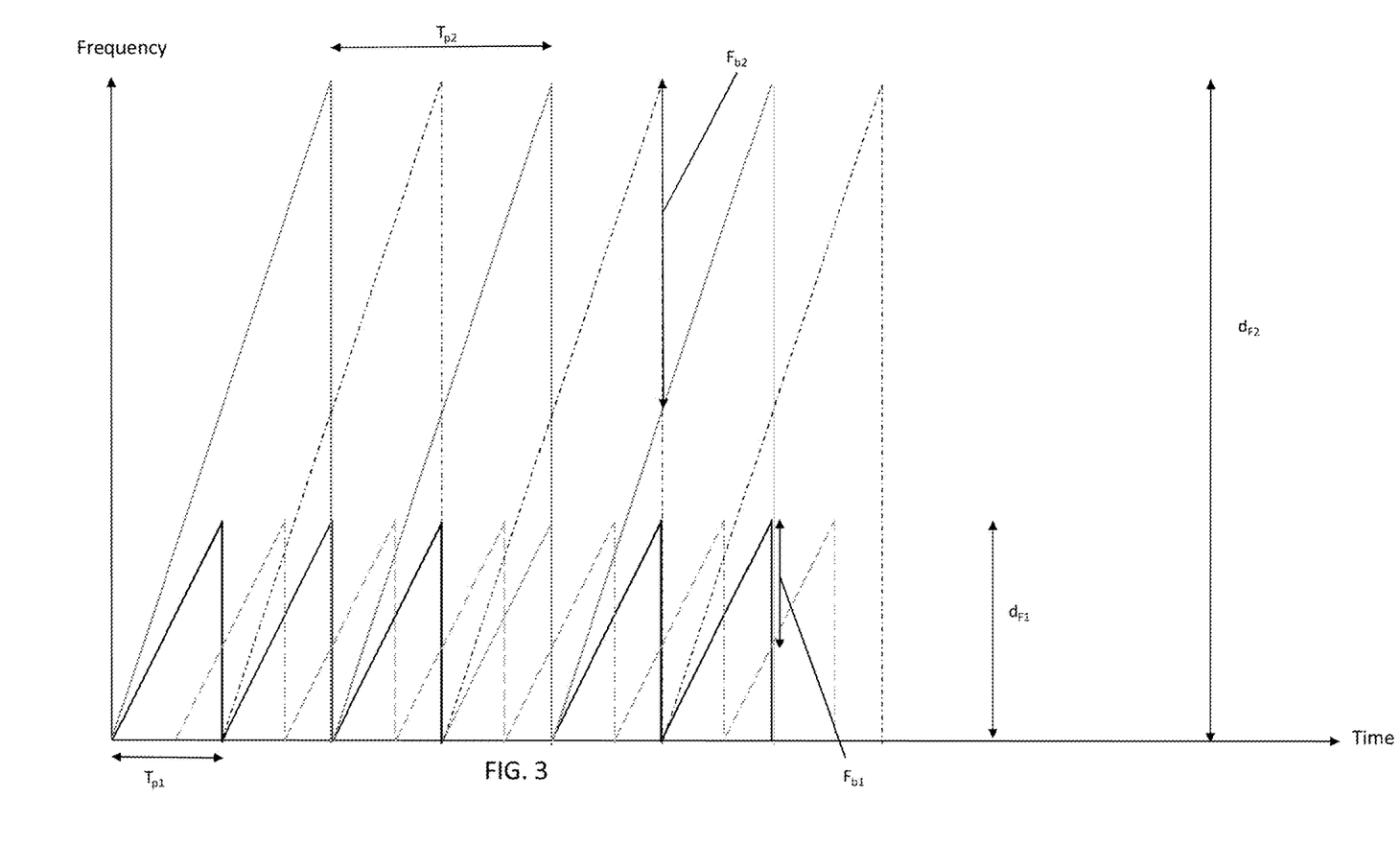
FIG. 3 graphically illustrates the principle of operation of the embodied system.

FIG. 3 provides further details on the distance measuring method employed within the distance measuring pixel. Lasers 12 and 14 are modulated in a frequency modulated continuous wave format (FMCW) wherein the instantaneous frequency of optical radiation of each laser is periodically shifted or chirped by $dF_1$ and $dF_2$ such that $dF_1$ is equal to or less than $0.5dF_2$. The periodic and linear frequency chirp may practically be performed by applying a saw tooth modulation to the injection current, junction temperature, bias current of the gain region, or any combinations of these methods. The combined output of lasers 12 and 14 passes an optical isolator 54 to avoid deterioration from reflections back into the laser cavity. Combining or optically mixing the reflected first chirped echo light signal 106 from a remote object with the first chirped LO light signals 104 reflected from the partial Faraday mirror 60, and the second chirped echo light signal 206 with the second chirped LO light signal 204 onto the surface of photodetectors 50 and 52 produces a modulation of the photocurrent of each detector at a first 'beat' frequency 108 that is the difference of the frequency chirp of the first LO signal 104 and first echo signal 106, and a second 'beat' frequency 208 that is the difference of the frequency chirp of the second LO signal 204 and second echo signal 206. The two beat frequencies are different, but proportional to the target distance, wherein the first beat frequency 108 depends on the first chirp amplitude $dF_1$, and first chirp duration $T_{p1}$, while the second beat frequency 208 depends on the second chirp amplitude $dF_2$, and second chirp duration $T_{p2}$ as described by the range resolution equation of an FMCW system:

$$dR_1 = c/2dF_1, \ dR_2 = c/2dF_2,$$

where c is the speed of light in air, and $dR_1$, $dR_2$ are the minimum ranges that can be resolved using each chirp. The beat frequency tones produced:

$$F_{b1} = (dF_1/Tp_1)*(2D/c)$$

$$F_{b2} = (dF_2/Tp_2)*(2D/c),$$

where $F_{b1}$ and $F_{b2}$ are the first and second beat frequencies, c is the speed of light in air, and D is the distance to the target.

Following the optical mixing of the LO and echo light signals on the photodetectors 50 and 52, a post detection processing may be performed by electronic circuitry 70 which may include time averaging, band pass filtering (BPF), FMCW demodulation, amplification, analog to digital conversion, and fast Fourier Transform (FFT) processing to decode the distance encoded within the beat frequency. All or part of the set of these components may be incorporated into the photonic circuit, or as a subsystem collocated with the photonic circuit on a separate rigid substrate along with the photonic circuit such as a printed circuit board.

While it is desirable to maximize the chirp amplitude dF for greater precision in distance measurement, and minimize Tp for fast data acquisition, the resulting beat frequency bandwidth also increases as the chirp rate dF/Tp increases. The current state of the art in post detection processing technologies puts practical limitations on beat frequency bandwidths to 1 GHz. To mitigate this challenge, systems must either employ smaller chirp amplitudes dF, or increase Tp with a large dF to preserve fine resolution measurements capable of digitization.

The embodied invention circumvents this tradeoff by employing multiple lasers with different chirp amplitudes dF and chirp rates dF/Tp. In one arrangement (FIG. 1), the first beat tone 108 produced by the first LO signal 104 and first echo signal 106 from the first laser 12 with a smaller chirp $dF_1$, but faster chirp rate $dF_1/Tp_1$ occurs at a lower frequency and for a shorter duration than the second beat tone 208 produced by the mixing of the second LO signal 204 and second echo signal 206 from a second laser 14, which has a slower chirp rate $dF_2/Tp_2$ and larger chirp $dF_2$. For example, the first chirp $dF_1$ may be 150 MHz with a pulse time $Tp_1$ of 1 μsecond, while the second chirp $dT_2$ may be 150 GHz, with a pulse time $Tp_2$ of 10 μsecond. According to the FMCW range resolution equation the first chirp produces an accuracy of 1 meter, while the second chirp produces an accuracy of 1 millimeter. To measure a point at a distance of 20 meters, the first beat frequency tone 108 occurs at 20 MHz, and can be measured within a time between 0.1 and 10 μseconds. The second beat frequency tone 208 for the same measurement lasts for 1 ns to 1 μs and occurs at 2 GHz, which would normally be beyond the upper bound of practical signal digitization capabilities. However, one can use the first beat frequency 108 as a priori knowledge of the smallest beat frequency that may be produced with the second chirp $dT_2$, for the same measurement, and tune a wide bandwidth frequency synthesizer to output this as a synthesized LO signal frequency.

Figure 4A:
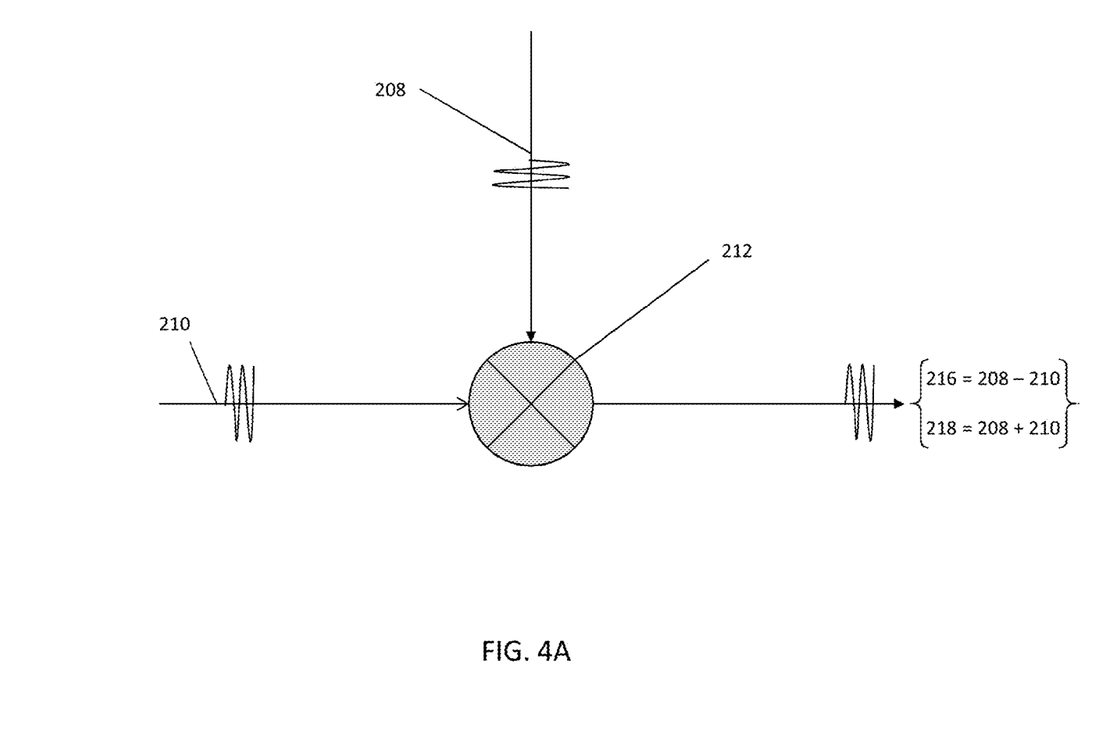
FIG. 4A schematically shows the electrical down conversion process.

It is well understood in radio frequency electronics that the mixing of two sine wave signals of different frequencies results in a pair of frequencies that are the sum and difference of the two mixed signals. This is highlighted in FIG. 4A. For the previous example, since the range resolution of the first chirp is 1 meter, the minimum beat frequency that may be produced by the second chirp would be 1.9 GHz (at 20 meters distance, the lower bound of the range accuracy with the first chirp=19 meters). By electrically mixing the second beat frequency 208 of 2 GHz with the synthesized LO frequency 210 of 1.9 GHz, in RF mixer 212, third and fourth frequencies 216, 218 of 100 MHz and 3.9 GHz would be generated. By disregarding the higher sum frequency using, for example, a low pass filter, and processing only the lower difference frequency, the 2 GHz bandwidth of the second beat frequency may be reduced to 100 MHz making the process of sampling and digitization possible with inexpensive analog-to-digital technologies. Furthermore, since the first beat frequency occurs for a much shorter time than the second beat frequency, it can be measured at a rate fast enough to tune the frequency synthesizer to output the synthesized LO frequency within the second beat duration, permitting fast data acquisition rates. In this manner, measurement distances exceeding 100 meters with measurement accuracies below 1 centimeter may be accomplished rapidly and without the need for expensive, high frequency digitization electronics.

Figure 4B:
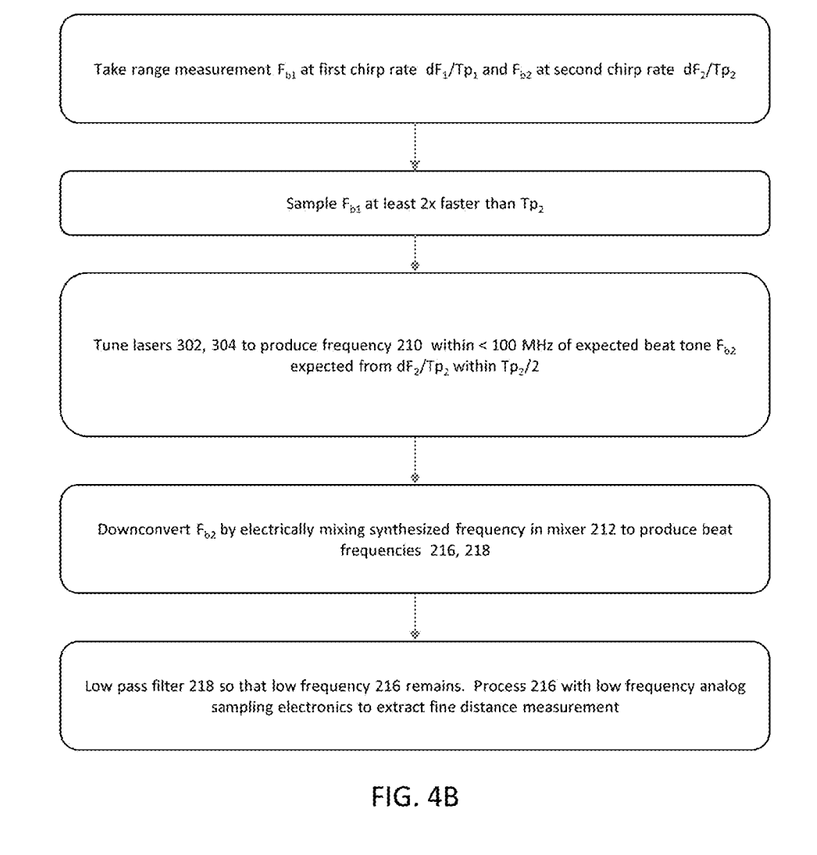
FIG. 4B and FIG. 4C show flow charts highlighting the operation of the system in accordance with aspects of the invention.
Figure 4C:
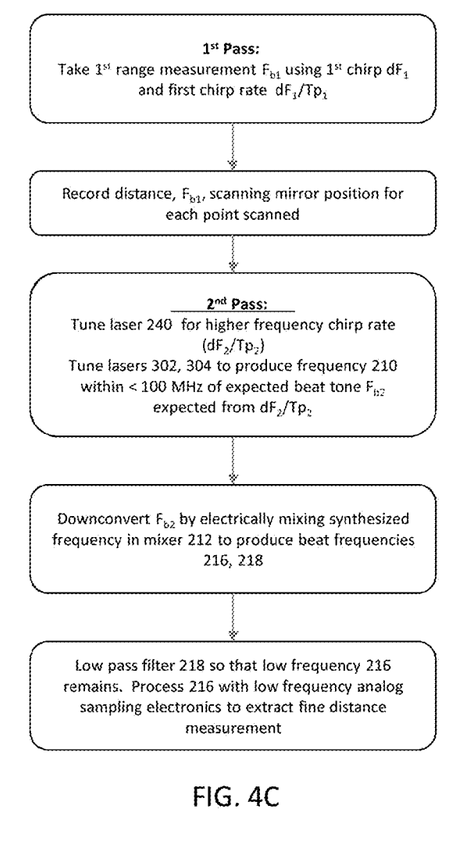

This sequence of making coarse, then fine measurements in a serial manner is highlighted in a flow chart in FIG. 4B. Alternatively, one can implement a similar flow of measurement as described in FIG. 4C using the system shown as a block diagram in FIG. 2. In this case, a single laser 240 is used to take both the first, coarse measurement and then a second, fine measurement. In the first and second pass alternative method shown in FIG. 4C, the first measurement is made with the laser operating with a smaller chirp $dF_1$. Once the measured beat frequency is recorded, the frequency synthesizer is tuned to generate a synthesized frequency at the lower bound of the predicted beat frequency expected with the higher chirp rate $dF_2$. A tuning circuit 70 is then used to tune the single laser 240 to chirp with $dF_2$, and the resulting beat frequency is electrically mixed with the synthesized LO frequency to a reduced signal bandwidth and processed using inexpensive digitization technologies.

Figure 5A:
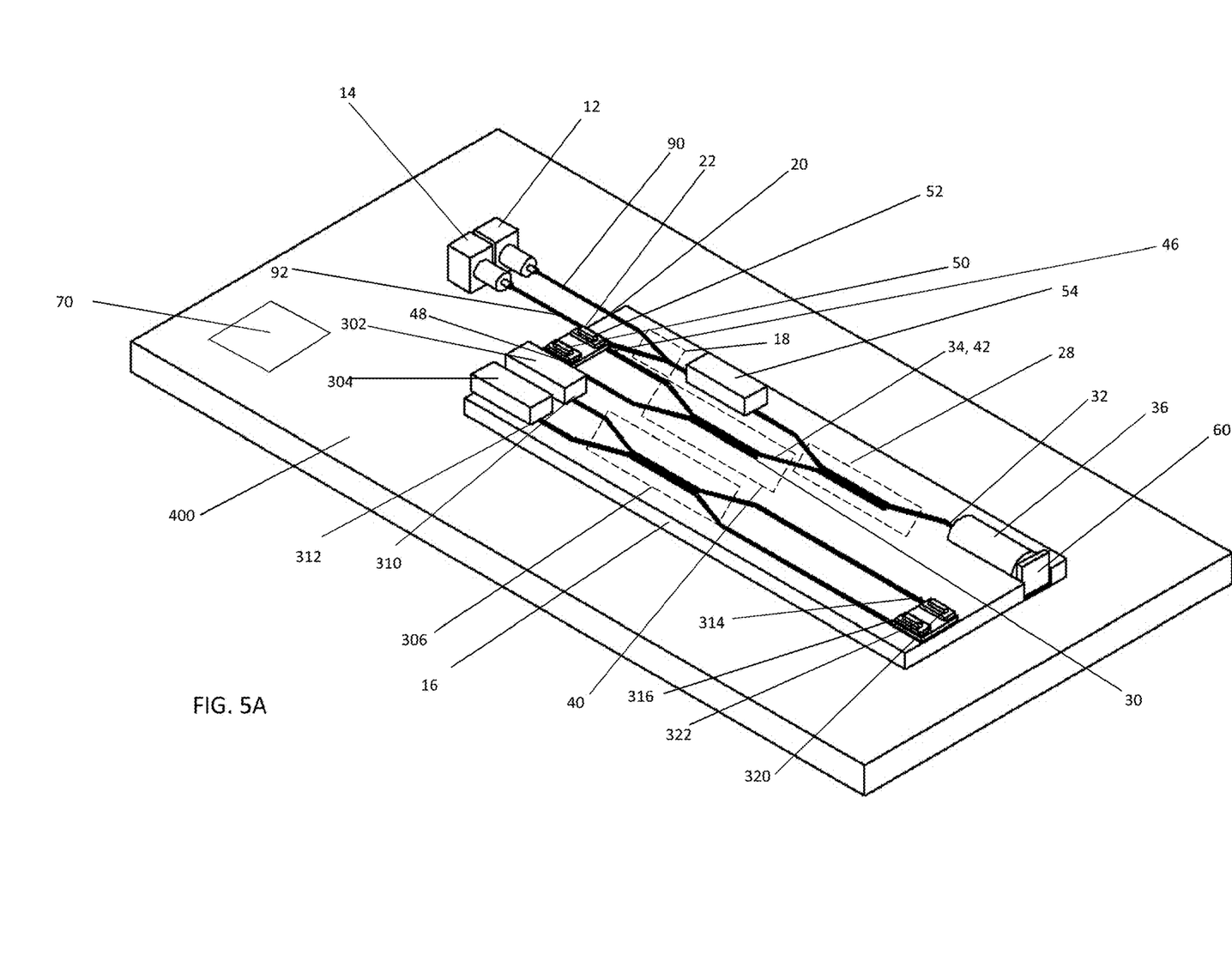
FIG. 5A shows a detailed schematic diagram of a photonic circuit according to an aspect of the invention.

A known method of obtaining a widely tunable synthesized LO frequency involves using a pair of lasers with non-identical, but close emission frequencies wherein the difference in their emission frequencies is <10 GHz. In the present invention a third laser 302 and a fourth laser 304 are opotomechanically coupled to a first input port 310 and a second input port 312 of a second optical combiner 306 in photonic circuit 16 as shown in FIG. 5A. Photodetectors 320 and 322 are each respectively optomechanically coupled to a first output port 314 and a second output port 316 of combiner 306, where the optical mixing of a third light beam 330 from the third laser 302 and fourth light beam 340 from the fourth laser 304 produce a synthesized beat frequency 308 that is the difference in the emission frequencies of lasers 302 and 304. This forms the synthesized LO frequency. Synthesized LO frequencies ranging from a few MHz-THz may be generated by holding the emission of either laser 302 or 304 constant, while tuning the emission frequency of the other by modifying its injection current, gain medium, temperature, or cavity length, or any combination of the four.

FIG. 5A shows an advantageous embodiment of the photonic integrated circuit in greater detail. The gradient index rod lens 36 and partial Faraday mirror 60 may be integrated within the photonic circuit using silicon optical bench technology. Using semiconductor fabrication methods, very precise grooves and alignment holes may be formed on the photonic integrated circuit substrate into which the free space optical components such as the gradient index rod lens 36, partial Faraday mirror 60 can be placed. The photonic circuit substrate may also integrate an optical isolator 54. The waveguides for the 3 dB couplers may be formed on a substrate such as silicon, or glass, using appropriate material layers transparent to the laser radiation. For example, $Si_3N_4$, and $SiO_2$ can be used as the core and cladding materials in the near infrared through long-wave infrared spectrum, while Si and $SiO_2$ can be used for core/cladding layers in the near-to-mid infrared spectrum.

Lasers 12 and 14 may advantageously be distributed feedback (DFB) or distributed Bragg Reflector (DBR) lasers with linewidths of ≤1 MHz in a package separate to the photonic circuit 16 and coupled to the first and second input ports 20, and 22 of first optical combiner 18 using polarization maintaining fiber pigtails 90 and 92 with the polished fiber face butt coupled to an input ports 20 and 22 of combiner 18. Lasers 12 and 14 may contain an integrated optical isolator, and the laser package as well as the photonic circuit may be collocated on a planar rigid substrate 400. Laser 302 and 304 may preferably be distributed feedback (DFB), distributed Bragg Reflector (DBR), or Vertical cavity surface emitting lasers (VCSELSs) with linewidths of ≤1 MHz, and may also be similarly packaged and optomechanically coupled to photonic circuit 16.

Alternatively the die for each of the lasers may be prefabricated on their own respective substrate material and bonded to the photonic circuit substrate 16, and may be optically coupled to their respective combiner input ports using either butt coupling or evanescent coupling which are well developed in the art. The lasers may also be formed directly in the photonic circuit 16 by bonding the laser gain medium such as a III-V semiconductor material to the photonic circuit 16 substrate into which the laser cavity has been formed as described in U.S. Pat. No. 8,620,164.

Similarly the photodetectors may be packaged in an assembly along with signal amplification circuits on a rigid printed circuit board and bonded to photonic circuit 16 aligned with the output ports of the second directional coupler 40 and the second optical combiner 306. Fiber pigtails may also be employed as the optical coupling between the output ports 46, 48, 314 and 316 and the photodetectors 50, 52, 320 and 322 respectively. Alternatively, the photodetectors may be formed directly as part of the photonic circuit, either by appropriately doping the substrate material with impurity materials, or via the deposition of epitaxial films of photosensitive material with a spectral response to the laser radiation. These materials may include Si, InGaAs, and Ge. Each pair of photodetectors 50 and 52, as well as 320 and 322 may be electrically connected in a balanced configuration such that their photocurrents cancel. In this case, it is necessary to equalize the DC optical power impinging upon each photodiode. When this is done, the effective output of the balanced pair of photodiodes is zero until there is some difference in the intensity of one of the beams. When this occurs, it causes the pair to become "unbalanced" and a net signal appears on the output. To avoid the often tedious, manual task of balancing the intensities of the two beams, an autobalancing circuit can be employed which was originally developed by Hobbs (U.S. Pat. No. 5,134,276). A biaxial scanning MEMS mirror, or motorized mirrors capable of scanning along two independent axes can be placed downstream of the focusing optics 64 to sweep the chirped first and second laser light beams 102 and 202 and create two dimensional range images of scanned objects and environments.

Figure 5B:
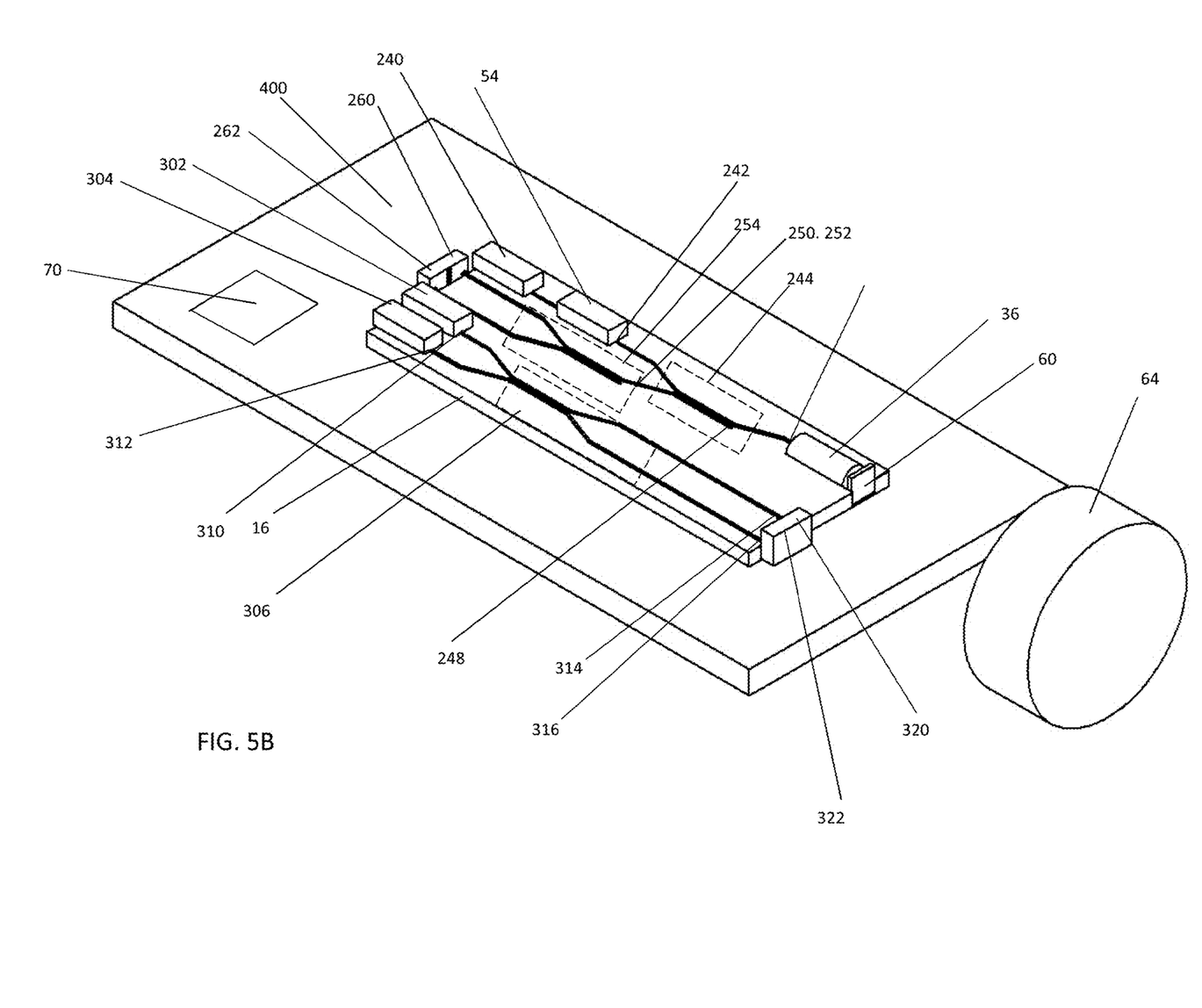
FIG. 5B schematically shows an alternative embodiment of the photonic circuit.

FIG. 5B shows a photonic circuit design for the embodiment of the present invention that uses a single laser to perform both the coarse and fine resolution range measurements in sequential passes. A block diagram and sequence of operation for this design is shown in FIG. 2 and FIG. 4B.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

We claim:

1. A distance measuring apparatus, comprising:
   a first laser diode with a first frequency chirp $dF_1$ and first chirp rate ($dF_1/Tp_1$);
   a second laser diode with a second frequency chirp $dF_2$ and second chirp rate ($dF_2/Tp_2$);
   a planar lightwave circuit including a pair of photodetectors, a combiner optomechanically connected to a cascaded pair of 3 dB directional couplers, a gradient index rod lens, and a partially reflective Faraday mirror optomechanically coupled to the gradient index rod lens, wherein the first laser diode is optically coupled to a first input port of the combiner, the second laser diode is optically coupled to a second input port of the combiner, a first output port of the combiner is optically coupled to a first input port of a first 3 dB directional coupler, a first output port of the first directional coupler is optomechanically coupled to the gradient index rod lens, the second input port of the first directional coupler is optomechanically connected to a first input port of a second directional coupler, and the two output ports of the second directional coupler are each optomechanically coupled to a photodetector;

further comprising a third laser diode optomechanically coupled to a first input port of a second combiner on the planar lightwave circuit, and a fourth laser diode optomechanically coupled to a second input port of the second combiner, a third photodetector coupled to a first output port of the second combiner, and a fourth photodetector optomechanically coupled to a second output port of the second combiner.

2. The distance measuring apparatus of claim 1, wherein the second output port of the first directional coupler and the second input port of the second directional coupler are optically terminated.

3. The distance measuring apparatus of claim 1, wherein the second chirp frequency $dF_2$ is equal to or greater than twice the first chirp frequency $dF_1$ and the second chirp rate $(dF_2/Tp_2)$ is equal to or less than one-half the first chirp rate $(dF_1/Tp_1)$.

4. The distance measuring apparatus of claim 1, wherein the first and second laser diodes have tunable emission frequencies.

5. The distance measuring apparatus of claim 1, wherein the first and second laser diodes are linearly polarized.

6. The distance measuring apparatus of claim 1, further comprising an optical isolator disposed in the optical path between the first laser and the planar lightwave circuit.

7. The distance measuring apparatus of claim 1, further comprising an optical isolator disposed in the optical path between the second laser and the planar lightwave circuit.

8. The distance measuring pixel of claim 1, wherein the first and second photodetectors are electrically connected in an autobalanced amplifier.

9. The distance measuring pixel of claim 1, wherein the third and fourth photodetectors are electrically connected in an autobalanced amplifier.

10. The distance measuring apparatus of claim 1, wherein the third and fourth laser are optically coupled to the third and fourth detectors, wherein the third and fourth detectors output a synthesized beat frequency that is the difference between the emission frequencies of the third and fourth lasers.

11. The distance measuring apparatus of claim 10, wherein a control loop adjusts the emission frequency of the third and fourth laser diodes relative to each other to obtain a specific beat frequency from the third and fourth photodetectors.

12. The distance measuring apparatus of claim 1, wherein the third and fourth lasers are vertical cavity surface emitting lasers (VCSELS).

13. The distance measuring apparatus of claim 1, wherein the lasers and planar waveguide circuit are disposed on a common rigid substrate.

14. The distance measuring apparatus of claim 1, wherein the photodetectors and planar waveguide circuit are disposed on a common rigid substrate.

15. The distance measuring apparatus of claim 1, wherein the photodetectors comprise deposited photosensitive semiconductor materials within the planar lightwave circuit.

16. The distance measuring apparatus of claim 1, further comprising an RF mixing circuit adapted to electrically mix wherein the synthesized beat frequency produced at the third and fourth photodetectors with the beat frequency produced at the first and second photodetectors.

17. A distance measuring method, comprising:
measuring a first beat frequency produced by optically mixing a first echo light beam with a first chirp rate and a first local oscillator (LO) light beam with a first chirp rate from a first laser at a first and second photodetector;
estimating a range of possible beat frequencies for a second chirp rate from the first beat frequency;
tuning the emission frequencies of two different lasers relative to each other to produce a synthesized beat frequency at a third and a fourth photodetector;
producing a second beat frequency by optically mixing a second echo light beam with a second chirp rate and a second LO light beam with a second chirp rate from at least the first laser at the first and second photodetectors;
producing a <1 GHz third beat frequency by electrically mixing the synthesized beat frequency with the second beat frequency; and
processing the third beat frequency to determine a distance measurement.

18. The distance measuring method of claim 17, further comprising using a second laser that is different than the first laser to produce the second echo and LO light beams with a second chirp rate, and optically mixing the second echo and LO light beams on the first and second photodetector to produce the second beat frequency.

* * * * *